United States Patent
Lai et al.

(10) Patent No.: US 6,573,188 B1
(45) Date of Patent: Jun. 3, 2003

(54) END POINT DETECTION METHOD FOR FORMING A PATTERNED SILICON LAYER

(75) Inventors: Tsung-Mu Lai, Jubei (TW); Hua-Shu Wu, Hsinchu (TW); Wan-Sheng Tseng, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/143,670

(22) Filed: May 9, 2002

(51) Int. Cl.⁷ ............................................. H01L 21/311
(52) U.S. Cl. ..................................................... 438/700
(58) Field of Search ................... 438/700, 689

(56) References Cited

U.S. PATENT DOCUMENTS

| | | | | |
|---|---|---|---|---|
| 4,528,438 A | * | 7/1985 | Poulsen et al. | 219/121 |
| 5,747,380 A | * | 5/1998 | Yu et al. | 438/599 |
| 6,306,755 B1 | * | 10/2001 | Zheng | 438/631 |

* cited by examiner

*Primary Examiner*—David Nelms
*Assistant Examiner*—Thao P. Le
(74) *Attorney, Agent, or Firm*—Tung & Associates

(57) ABSTRACT

Within a method for selectively etching a second silicon layer with respect to a first silicon layer upon which is formed the second silicon layer there is employed an etch detection layer interposed between a first region of the first silicon layer and the second silicon layer, but not a second region of the first silicon layer and the second silicon layer. The etch detection layer provides for enhanced endpoint detection when selectively etching the second silicon layer with respect to the first silicon layer.

11 Claims, 2 Drawing Sheets

END POINT DETECTION METHOD FOR FORMING A PATTERNED SILICON LAYER

BACKGROUND OF THE INVENTION

1. Field of the Invention

The present invention relates generally to methods for forming patterned silicon layers within microelectronic fabrications. More particularly, the present invention relates to methods for forming, with enhanced process control, patterned silicon layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic layer dimensions have decreased, it has become increasingly more difficult in the art of microelectronic fabrication to form within microelectronic fabrication patterned microelectronic layers with enhanced process control.

It is thus desirable in the art of microelectronic fabrication to form within microelectronic fabrications patterned microelectronic layers with enhanced process control.

It is towards the foregoing object that the present invention is directed.

Various methods have been disclosed in the art of microelectronic fabrication for forming, with desirable properties within microelectronic fabrications, patterned microelectronic layers.

Included among the methods, but not limiting among the methods, are methods disclosed within: (1) Poulsen et al., in U.S. Pat. No. 4,528,438 (a plasma etch method for forming within a microelectronic fabrication a patterned microelectronic layer with enhanced endpoint detection, by employing within the plasma etch method an emission spectroscopy endpoint detection method) ; (2) Yu et al., in U.S. Pat. No. 5,747,380 (a plasma etch method for forming within a microelectronic fabrication a patterned microelectronic layer with enhanced endpoint detection by employing within a substrate which is etched within the plasma etch method dummy features such as to enhance within the plasma etch method optical emission endpoint detection); and (3) Zheng, in U.S. Pat. No. 6,306,755 (another plasma etch method for forming within a microelectronic fabrication a patterned microelectronic layer with enhanced endpoint detection by employing within a substrate which is etched within the plasma etch method dummy features such as to enhance within the plasma etch method optical emission endpoint detection).

Desirable in the art of microelectronic fabrication are additional methods and materials through which there may be formed within microelectronic fabrications patterned microelectronic layers with enhanced process control.

It is towards the foregoing object that the present invention is directed.

SUMMARY OF THE INVENTION

A first object of the present invention is to provide a method for forming a patterned microelectronic layer within a microelectronic fabrication.

A second object of the present invention is to provide a method in accord with the first object of the present invention, wherein the patterned microelectronic layer is formed with enhanced process control.

In accord with the objects of the present invention, there is provided by the present invention a method for forming a patterned silicon layer within a microelectronic fabrication.

To practice the method of the present invention, there is first provided a substrate having formed thereover a first silicon layer selected from the group consisting of amorphous silicon layers, polycrystalline silicon layers, monocrystalline silicon layers and germanium alloy layers thereof. Within the present invention, the first silicon layer has a first region laterally adjacent a second region. There is then formed over the first region of the first silicon layer but not over the second region of the first silicon layer an etch detection layer. There is then formed over the first region of the first silicon layer, the second region of the first silicon layer and the etch detection layer, and contacting both the etch detection layer and the second region of the first silicon layer, a second silicon layer selected from the group consisting of amorphous silicon layers, polycrystalline silicon layers, monocrystalline silicon layers and germanium alloy layers thereof. There is then formed over the second silicon layer a masking layer which defines: (1) a first aperture over the first region of the first silicon layer and the etch detection layer; and (2) a second aperture over the second region of the first silicon layer. Finally, there is then etched simultaneously the second silicon layer within the first aperture and the second aperture while employing the etch detection layer as an endpoint detection layer such as to substantially completely etch within the second region the second silicon layer but insubstantially etch within the second region the first silicon layer. Alternatively phrased, the invention provides for forming over a substrate a first silicon layer having formed thereover a second silicon layer, where an etch detection layer is formed interposed between a first region of the first silicon layer and the second silicon layer but not an adjacent second region of the first silicon layer and the second silicon layer. The etch detection layer provides a means for etch process control such as to substantially completely etch the second silicon layer within the second region, but insubstantially etch the first silicon layer within the second region.

The present invention provides a method for forming a patterned microelectronic layer within a microelectronic fabrication, wherein the patterned microelectronic layer is formed with enhanced process control.

The present invention realizes the foregoing object by employing when forming a patterned second silicon layer upon a first silicon layer within a microelectronic fabrication an etch detection layer interposed between a first region of a second silicon layer and the first silicon layer, but not a second region of the second silicon layer and the first silicon layer, such that when simultaneously etching the second silicon layer within a first aperture and a second aperture defined by a patterned masking layer formed over the first region and the second region while employing the etch detection layer as an endpoint detection layer there may be substantially completely etched within the second region the second silicon layer but insubstantially etched within the second region the first silicon layer. Alternatively phrased, the invention provides for forming over a substrate a first silicon layer having formed thereover a second silicon layer, where an etch detection layer is formed interposed between a first region of the first silicon layer and the second silicon layer but not an adjacent second region of the first silicon layer and the second silicon layer. The etch detection layer provides a means for etch process control such as to substantially completely etch the second silicon layer within the second region, but insubstantially etch the first silicon layer within the second region.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
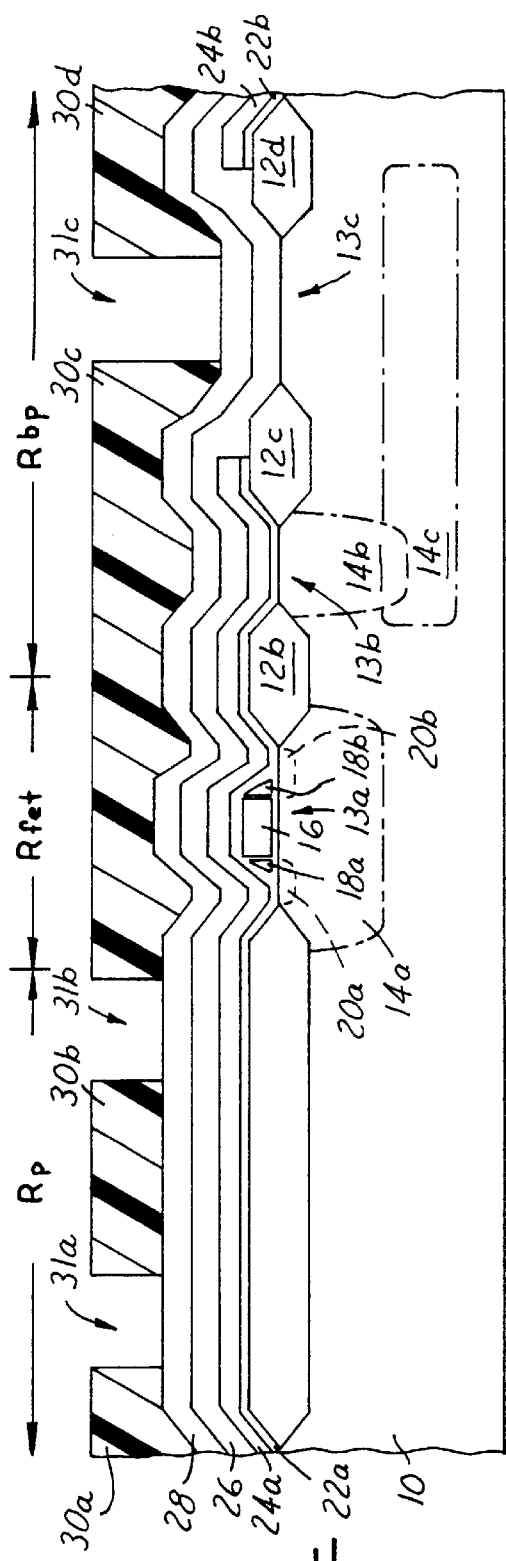
FIG. 1, FIG. 2, FIG. 3 and FIG. 4 show a series of schematic cross-sectional diagrams illustrating the results of progressive stages of forming, in accord with a preferred embodiment of the present invention, a pair of patterned polysilicon layers employed as an extrinsic base region within a vertical bipolar transistor device within a bipolar complementary metal oxide semiconductor (BiCMOS) integrated circuit microelectronic fabrication.

The present invention provides a method for forming a patterned microelectronic layer within a microelectronic fabrication, wherein the patterned microelectronic layer is formed with enhanced process control.

The present invention realizes the foregoing object by employing when forming a patterned second silicon layer upon a first silicon layer within a microelectronic fabrication an etch detection layer interposed between a first region of a second silicon layer and the first silicon layer, but not a second region of the first silicon layer and the second silicon layer, such that when simultaneously etching the second silicon layer within a first aperture and a second aperture defined by a patterned masking layer formed over the first region and the second region while employing the etch detection layer as an endpoint detection layer there may be substantially completely etched within the second region the second silicon layer but insubstantially etched within the second region the first silicon layer. Alternatively phrased, the invention provides for forming over a substrate a first silicon layer having formed thereover a second silicon layer, where an etch detection layer is formed interposed between a first region of the first silicon layer and the second silicon layer but not an adjacent second region of the first silicon layer and the second silicon layer. The etch detection layer provides a means for etch process control such as to substantially completely etch the second silicon layer within the second region, but insubstantially etch the first silicon layer within the second region.

Although the preferred embodiment of the present invention illustrates the present invention most particularly within the context of forming within a vertical bipolar transistor device within a bipolar complementary metal oxide semiconductor (BiCMOS) integrated circuit microelectronic fabrication a pair of patterned polysilicon layers as extrinsic base regions absent substantial etching into a monocrystalline silicon semiconductor substrate upon which is formed the pair of patterned polysilicon layers, the present invention may in a more general sense be employed for forming a patterned second silicon layer upon a first silicon layer without substantially etching into the first silicon layer, wherein each of the first silicon layer and the patterned second silicon layers are independently formed of silicon materials including but not limited to amorphous silicon materials, polycrystalline silicon materials, monocrystalline silicon materials and germanium alloy materials thereof. The present invention also contemplates that any of the foregoing materials will have incorporated therein dopant materials, as are conventional in the art of semiconductor integrated circuit microelectronic fabrication. Under such circumstances, the present invention also contemplates that the first silicon layer may be formed to a thickness of from about $10^3$ to about $10^7$ angstroms and the second silicon layer may be formed to a thickness of from about $10^3$ to about $10^4$ angstroms. In addition, the present invention is not intended as directed towards patterning of silicon containing dielectric material layers, such as but not limited to silicon oxide layers, silicon nitride layers and silicon oxynitride layers. Finally, the present invention may be employed within the context of fabricating patterned silicon layers within microelectronic fabrications selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Referring now to FIG. 1 to FIG. 4, there is shown a series of schematic cross-sectional diagrams illustrating the results of progressive stages of forming, in accord with a preferred embodiment of the present invention, a bipolar complementary metal oxide semiconductor (BICMOS) semiconductor integrated circuit microelectronic fabrication having formed therein a pair of patterned polysilicon layers which forms a pair of extrinsic base regions within a vertical bipolar transistor within the bipolar complementary metal oxide semiconductor (BiCMOS) integrated circuit microelectronic fabrication.

Shown in FIG. 1 is a schematic cross-sectional diagram of the bipolar complementary metal oxide semiconductor (BiCMOS) integrated circuit microelectronic fabrication at an early stage in its fabrication in accord with the preferred embodiment of the present invention.

Shown in FIG. 1, in a first instance, is a semiconductor substrate 10 having formed therein a series of isolation regions 12a, 12b, 12c and 12d which define a series of active regions 13a, 13b and 13c of the semiconductor substrate 10. Also shown within the schematic cross-sectional diagram of FIG. 1 is a series of counter-doped regions 14a, 14b and 14c within the semiconductor substrate 10, where the counter-doped region 14a encompasses the active region 13a of the semiconductor substrate 10 and the counter-doped region 14b encompasses the active region 13b of the semiconductor substrate 10.

Within the preferred embodiment of the present invention, each of the semiconductor substrate 10, the series of isolation regions 12a, 12b, 12c and 12d and the series of counter-doped regions 14a, 14b and 14c may be formed employing methods and materials as are otherwise generally conventional in the art of semiconductor integrated circuit microelectronic fabrication.

Typically and preferably, but not exclusively, the semiconductor substrate 10 is a (100) monocrystalline silicon semiconductor substrate or monocrystalline silicon-germanium alloy semiconductor substrate having an N− or P− dopant concentration, although silicon semiconductor substrates and silicon-germanium alloy semiconductor substrates having other dopant concentrations and other crystallographic orientations may also be employed within the context of the present invention. Similarly, and also typically and preferably, the isolation regions 12a, 12b, 12c and 12d are formed as local oxidation of silicon (LOCOS) isolation regions as illustrated within the schematic cross-sectional diagram of FIG. 1, although other isolation regions, such as but not limited to shallow trench isolation (STI) regions, may also be employed within the context of the present invention. Finally, typically and preferably, the series of counter-doped regions 14a, 14b and 14c is formed of a P+ or N+ dopant polarity opposite the N− or P− dopant polarity of the semiconductor substrate 10, while typically and preferably employing ion implant methods as are conventional in the art of semiconductor integrated circuit microelectronic fabrication.

Also shown within the schematic cross-sectional diagram of FIG. 1 is a division of the semiconductor substrate 10 into a series of three regions, including: (1) a peripheral regions Rp; (2) a first product region Rfet within which is formed a field effect transistor (FET) device; and (3) a second product region Rbip within which is formed a bipolar transistor device.

As is further illustrated within the schematic cross-sectional diagram of FIG. 1, and as is formed within the first product region Rfet of the semiconductor substrate 10 within which is formed the field effect transistor (FET) device, is a series of structures which comprises the field effect transistor (FET) device. The series of structures which comprises the field effect transistor (FET) device specifically comprises: (1) a gate electrode 16 formed over the active region 13a of the semiconductor substrate 10; (2) a pertinent gate dielectric layer portion of a patterned contiguous gate dielectric, pad dielectric and passivation dielectric layer 22a; (3) a pair of spacer layers 18a and 18b; and (4) a pair of source/drain regions 20a and 20b.

Within the preferred embodiment of the present invention, each of the foregoing series of structures which comprises the field effect transistor (FET) device may be formed employing methods and materials as are otherwise generally conventional in the art of semiconductor integrated circuit microelectronic fabrication. For example, typically and preferably, the gate electrode 16 is formed to a thickness of from about 1000 to about 5000 angstroms from a doped polysilicon ( having a dopant concentration of greater than about 1E19 dopant atoms per cubic centimeter) or polycide (doped polysilicon/metal silicide stack) gate electrode material. In addition, typically and preferably, the gate dielectric layer portion of the patterned contiguous gate dielectric, pad dielectric and passivation dielectric layer 22a formed interposed between the gate electrode 16 and the active region 13a of the semiconductor substrate 10 is formed to a thickness of from about 20 to about 300 angstroms from a silicon oxide dielectric material. Further, typically and preferably, each of the pair of spacer layers 18a and 18b is formed at least in part of a dielectric material formed employing an anisotropic etching method. Finally, typically and preferably, each of the pair of source/drain regions 20a and 20b is formed employing an ion implantation method, while employing at least in part the gate electrode 16 as a mask, to provide the pair of source/drain regions 20a and 20b of dopant polarity opposite to the counter-doped region 14a and equivalent to the substrate 10.

Shown also within the schematic cross-sectional diagram of FIG. 1, and formed spanning each of the peripheral region Rp of the semiconductor substrate 10, the first product region Rfet of the semiconductor substrate 10 and the second product region Rbip of the semiconductor substrate 10 is a pair of patterned contiguous gate dielectric, pad dielectric and passivation dielectric layers 22a and 22b, in turn having formed aligned thereupon a pair of patterned first hard mask layers 24a and 24b (where the patterned first hard mask layer 24a serves as an etch detection layer within the peripheral region Rp of the semiconductor substrate).

Within the preferred embodiment of the present invention, each of the pair of patterned contiguous gate dielectric, pad dielectric and passivation dielectric layers 22a and 22b is, as is indicated above, typically and preferably formed at least in part of a silicon oxide dielectric material formed to a thickness of from about 100 to about 600 angstroms. Similarly, within the preferred embodiment of the present invention, each of the pair of patterned first hard mask layers 24a and 24b is formed aligned upon each of the pair of patterned contiguous gate dielectric, pad dielectric and passivation dielectric layers 22a and 22b to a thickness of from 1000 to about 3000 angstroms, while most typically and preferably formed of a silicon nitride hard mask material, although other hard mask materials, such as silicon oxide hard mask materials and silicon nitride hard mask materials, may also be employed within the context of the present invention.

Finally, there is also shown within the schematic cross-sectional diagram of FIG. 1, and formed upon exposed portions of the pair of patterned first hard mask layers 24a and 24b, the pair of patterned contiguous gate dielectric, pad dielectric and passivation dielectric layers 22a and 22b, the isolation regions 12c and 12d and the active region 13c of the semiconductor substrate 10, a blanket first polysilicon layer 26 having formed thereupon a blanket second hard mask layer 28. Similarly, there is also shown within the schematic cross-sectional diagram of FIG. 1, and formed upon the blanket second hard mask layer 28, a series of patterned first photoresist layers 30a, 30b, 30c and 30d which define a pair of first apertures 31a and 31b over the semiconductor substrate 10 within the peripheral region Rp of the semiconductor substrate 10 and a single second aperture 31c over the active region 13c of the semiconductor substrate 10 within the second product region Rbip of the semiconductor substrate 10.

Within the preferred embodiment of the present invention, the blanket first polysilicon layer 26 is formed of a doped polysilicon material of dopant polarity opposite to counter-doped region 14C. Typically and preferably, the blanket first polysilicon layer 26 is formed to a thickness of from about 1000 to about 5000 angstroms. Similarly, within the preferred embodiment of the present invention, the blanket second hard mask layer 28 may be formed of hard mask materials as are otherwise generally conventional in the art of semiconductor integrated circuit microelectronic fabrication, and in particular of hard mask materials analogous to the pair of patterned first hard mask layers 24a and 24b. Typically and preferably, the blanket second hard mask layer 28 is formed of a silicon oxide hard mask material, formed upon the blanket first polysilicon layer 26 to a thickness of from about 200 to about 500 angstroms. Finally, within the preferred embodiment of the present invention, the series of patterned first photoresist layers 30a, 30b, 30c and 30d may be formed from any of several types of photoresist materials as are generally conventional in the art of semiconductor integrated circuit microelectronic fabrication, including but not limited to positive photoresist materials and negative photoresist materials. Typically and preferably, each of the series of patterned first photoresist layers 30a, 30b, 30c and 30d is formed to a thickness of from about 5000 to about 20000 angstroms upon the blanket second hard mask layer 28.

Figure 2:
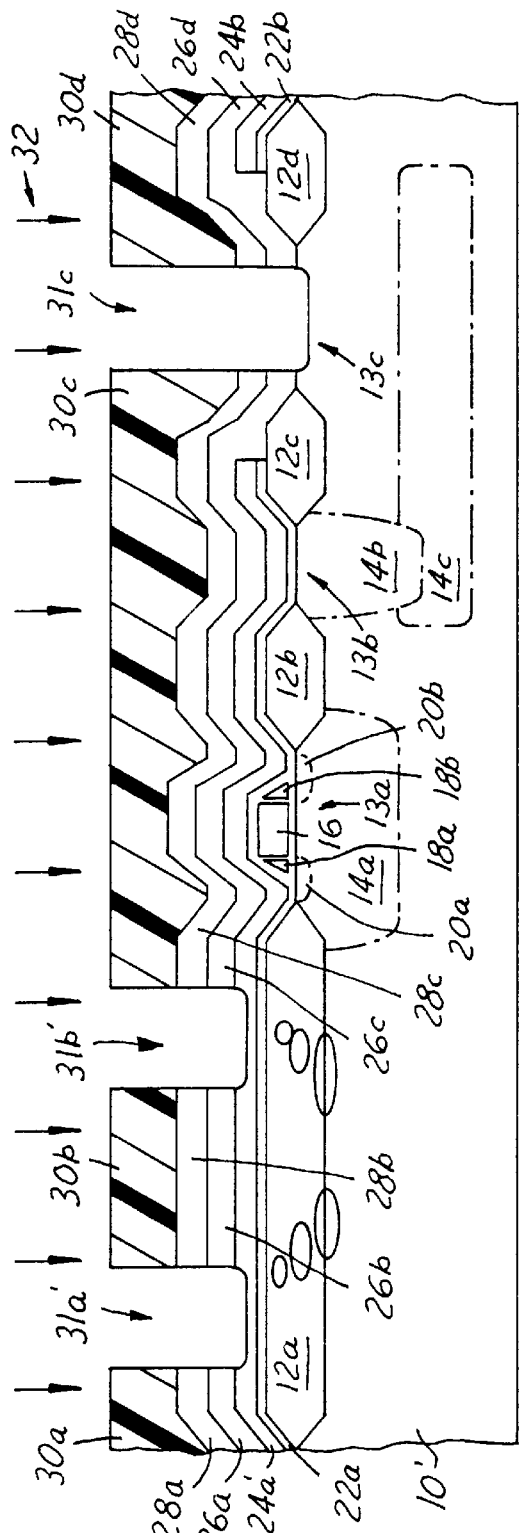

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated within FIG. 1, but wherein each of the blanket second hard mask layer 28 and the blanket first polysilicon layer 26 has been patterned to form a corresponding series of patterned second hard mask layers 28a, 28b, 28c and 28d and a corresponding series of patterned first polysilicon layers 26a, 26b, 26c and 26d, while employing the series of patterned photoresist layers 30a, 30b, 30c and 30d as a series of etch mask layers, in conjunction with a first etching plasma 32. Similarly, the foregoing patterning of the blanket second hard mask layer 28 and the blanket first polysilicon layer 26 while employing the first etching plasma 32 forms from the pair of first apertures 31a and 31b a pair of extended first apertures 31a' and 31b' and forms from the second aperture 31c an extended second aperture 31c'.

Within the preferred embodiment of the present invention, the first etching plasma 32 will typically and preferably employ a series of etchant gas compositions appropriate to the materials from which are formed the blanket second hard mask layer 28 and the blanket first polysilicon layer 26, which in turn will typically and preferably employ a fluorine containing etchant gas composition followed by a chlorine containing etchant gas composition.

Also illustrated within the schematic cross-sectional diagram of FIG. 2 is a slight etching into the patterned first hard mask layer 24a at the location of the pair of extended first apertures 31a' and 31b' to form a slightly etched patterned first hard mask layer 24a' (i.e., etched to a depth of no greater than about 700 angstroms and typically and preferably from about 100 to about 500 angstroms), and a slight etching into the semiconductor substrate 10 at the location of the extended second aperture 31c' to form a slightly etched semiconductor substrate 10 (i.e., etched to a depth of no greater than about 700 angstroms and typically and preferably from about 200 to about 500 angstroms).

As is understood by a person skilled in the art, when etching the blanket first polysilicon layer 26 within the pair of first apertures 31a and 31b and the second aperture 31c as illustrated within the schematic cross-sectional diagram of FIG. 1, the patterned first hard mask layer 24a serves as an etch detection layer, or alternatively an endpoint detection layer, such as to provide for substantially complete etching within the second product region Rbip of the semiconductor substrate 10 of the blanket first polysilicon layer 26 when forming the pair of patterned first polysilicon layers 26a and 26b (i.e., complete patterning of the blanket first polysilicon layer 26 when forming the pair of patterned first polysilicon layers 26a and 26b ), but insubstantial etching of the semiconductor substrate 10 within second product region Rbip of the semiconductor substrate 10 (i.e., etching within the context of the penetration depth indicated above). Thus, the presence of the patterned first hard mask layer 24a within the schematic cross-sectional diagram of FIG. 1, and its use within the context of etching the blanket first polysilicon layer 26 to form the series of patterned first polysilicon layers 26a, 26b, 26c and 26d as illustrated within the schematic cross-sectional diagram of FIG. 2, provides for an enhanced endpoint detection within the present invention, when in particular when forming the pair of patterned first polysilicon layers 26c and 26d which in turn serve as an extrinsic base region within a vertical bipolar transistor device formed incident to further processing of the semiconductor integrated circuit microelectronic fabrication whose schematic cross-sectional diagram is illustrated in FIG. 2.

As is similarly also understood by a person skilled in the art, in order to optimize the present invention, it is generally desirable for a series of first apertures, including in particular the first apertures 31a and 31b as illustrated within the schematic cross-sectional diagram of FIG. 1, to comprise from about 4% to about 8% area percent of a semiconductor substrate 10 so that a plasma etch emission intensity which is employed for endpoint detection is optimized. Similarly, within the preferred embodiment of the present invention, a plasma emission intensity of a carbon-nitrogen bonded species (i.e., with nitrogen derived from a silicon nitride patterned first hard mask layer 24 material and carbon derived from the series of patterned first photoresist layers 30a, 30b, 30c and 30d or a carbonaceous etchant gas component) may provide a particularly efficient optical emission endpoint detection probe.

Figure 3:
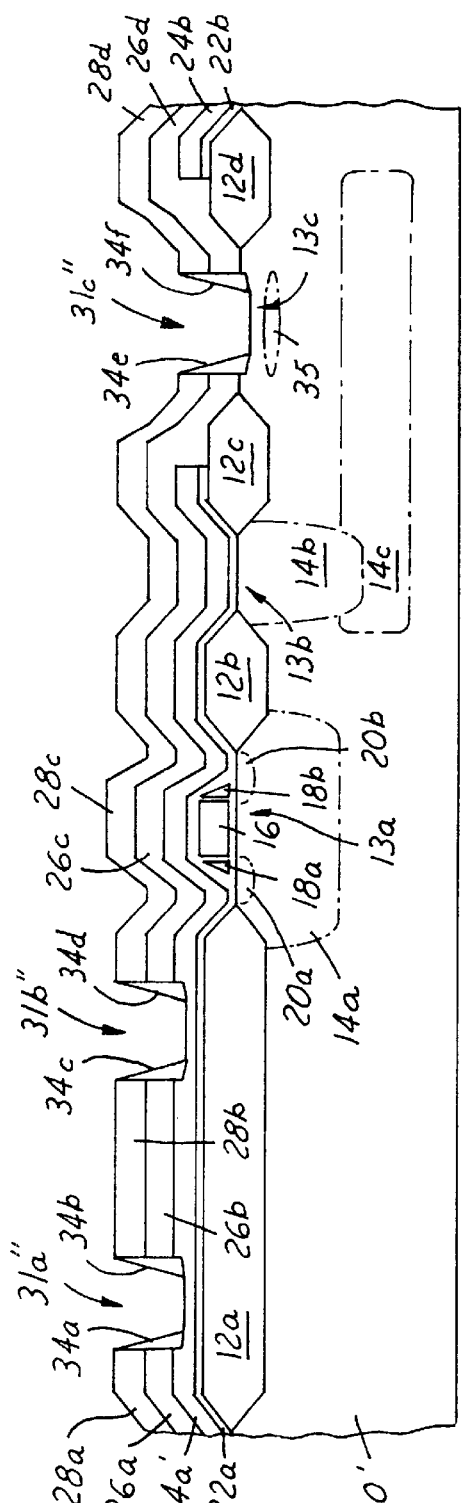

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein, in a first instance, there is stripped from the series of patterned second hard mask layers 28a, 28b, 28c and 28d, the series of patterned first photoresist layers 30a, 30b, 30c and 30d.

Within the preferred embodiment of the present invention, the series of patterned first photoresist layers 30a, 30b, 30c and 30d may be stripped from the series of patterned second hard mask layers within the semiconductor integrated circuit microelectronic fabrication whose schematic cross-sectional diagram is illustrated in FIG. 2 to provide in part the semiconductor integrated circuit microelectronic fabrication whose schematic cross-sectional diagram is illustrated in FIG. 3 while employing photoresist stripping methods and materials as are otherwise generally conventional in the art of semiconductor integrated circuit microelectronic fabrication.

Shown also within the schematic cross-sectional diagram of FIG. 3, after having stripped from the semiconductor integrated circuit microelectronic fabrication whose schematic cross-sectional diagram is illustrated in FIG. 2 the series of patterned first photoresist layers 30a, 30b, 30c and 30d from the series of patterned second hard mask layers 28a, 28b, 28c and 28d, is a base implant region 35 implanted within the semiconductor substrate 10 at the location of the active region 13c of the semiconductor substrate 10. Within the preferred embodiment of the present invention, the base implant region 35 is of polarity opposite to the counter-doped region 14C.

Finally, there is also shown within the schematic cross-sectional diagram of FIG. 3, and formed passivating the series of sidewalls of: (1) a pair of abbreviated first apertures 31a" and 31b" formed from the pair of extended first apertures 31a' and 31b'; and (2) an abbreviated second aperture 31c" formed from the extended second aperture 31c', a series of dielectric spacer layers 34a, 34b, 34c, 34d, 34e and 34f.

Within the preferred embodiment of the present invention, the series of dielectric spacer layers 34a, 34b, 34c, 34d, 34e and 34f may be formed employing anisotropic etching methods as are otherwise generally conventional in the art of semiconductor integrated circuit microelectronic fabrication. Typically and preferably, the series of dielectric spacer layers 34a, 34b, 34c, 34d, 34e and 34f is formed of a silicon nitride dielectric spacer material.

Figure 4:
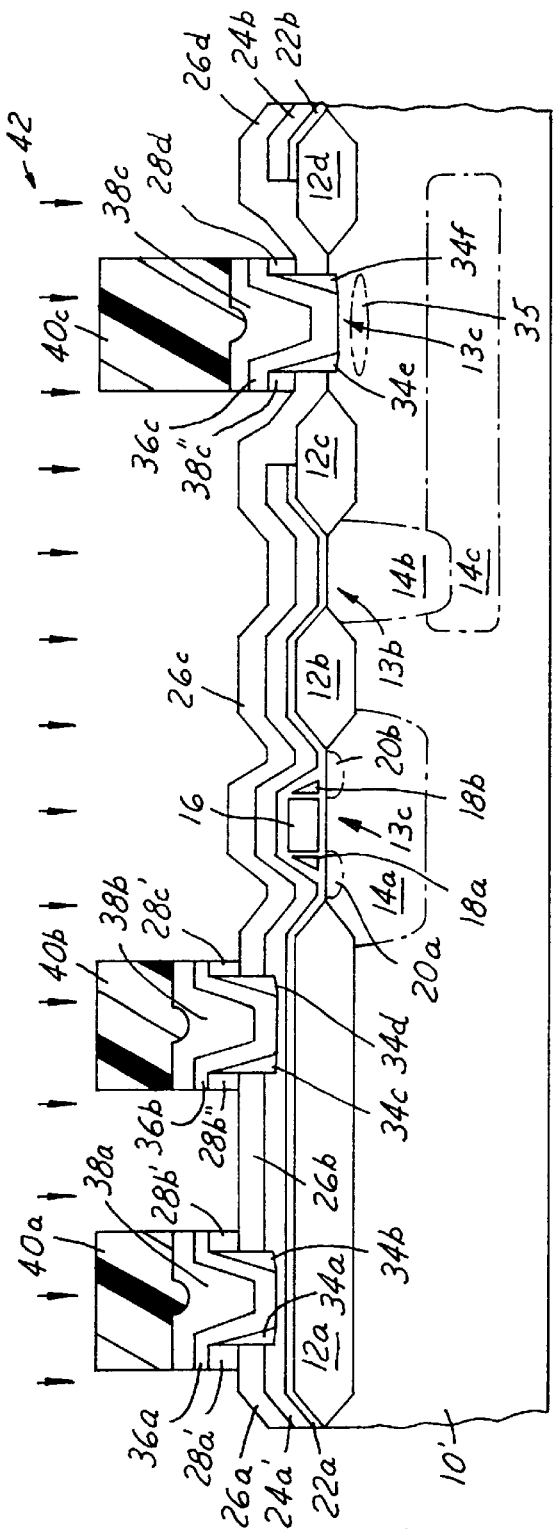

Referring now to FIG. 4, there is shown a schematic cross-sectional diagram illustrating the results of further processing of the semiconductor integrated circuit microelectronic fabrication whose schematic cross-sectional diagram is illustrated in FIG. 4.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein, in a first instance, there is formed upon exposed surfaces of the semiconductor integrated circuit microelectronic fabrication whose schematic cross-sectional diagram is illustrated in FIG. 3 a blanket second polysilicon layer (which is not otherwise specifically illustrated) in turn having formed thereupon a blanket third hard mask layer (which is similarly also not otherwise specifically illustrated). Finally, there is formed upon the blanket third hard mask layer a series of patterned second photoresist layers 40a, 40b and 40c, which is illustrated within the schematic cross-sectional diagram of FIG. 4.

Within the preferred embodiment of the invention, the blanket second polysilicon layer may be formed employing methods, materials and thickness dimensions analogous or equivalent to the methods, materials and thickness dimensions employed for forming the blanket first polysilicon layer 26 as illustrated within the schematic cross-sectional diagram of FIG. 1, but of opposite polarity.

Similarly, within the preferred embodiment of the present invention, the blanket third hard mask layer may be formed employing methods, materials and thickness dimensions analogous or equivalent to the methods, materials and thickness dimensions employed for forming the blanket second hard mask layer 28 as illustrated within the schematic cross-sectional diagram of FIG. 1.

Finally, the series of patterned second photoresist layers 40a, 40b and 40c may be formed employing methods, materials and thickness dimensions analogous or equivalent to the methods, materials and thickness dimensions employed for forming the series of patterned first photoresist layers 30a, 30b, 30c and 30d as illustrated within the schematic cross-sectional diagram of FIG. 1.

There is also shown within the schematic cross-sectional diagram of FIG. 4 the results of sequentially patterning the blanket third hard mask layer, the blanket second polysilicon layer and the patterned second hard mask layers 28a, 28b, 28c and 28d while employing the series of patterned second photoresist layers 40a, 40b and 40c as an etch mask layer in conjunction with a second etching plasma 42, to form a corresponding series of patterned third hard mask layers 38a, 38b and 38c aligned upon a corresponding series of patterned second polysilicon layers 36a, 36b and 36c further in part aligned upon a series of twice patterned second hard mask layers 28a', 28b', 28b'', 28c', 28c'' and 28d'.

Within the preferred embodiment of the present invention, the second etching plasma 42 sequentially employs a series of etchant gas compositions appropriate to the materials from which are formed the blanket third hard mask layer, the blanket second polysilicon layer and the series of patterned second hard mask layers 28a, 28b, 28c and 28d. Such a series of etchant gas compositions will typically and preferably include a fluorine containing etchant gas composition, followed by a chlorine containing etchant gas composition, further in turn followed by a fluorine containing etchant gas composition.

As is understood by a person skilled in the art, within the schematic cross-sectional diagram of FIG. 4 the patterned second polysilicon layer 36c serves as an emitter region, the pair of patterned first polysilicon layers 26c and 26d serves as an extrinsic base region, the base implant region 35 serves as an intrinsic base region, and the counter-doped regions 14b and 14c serve as a collector region, within a vertical bipolar transistor device within the bipolar complementary metal oxide semiconductor (BiCMOS) device whose schematic cross-sectional diagram is illustrated in FIG. 4.

Within the preferred embodiment of the present invention, the pair of patterned first polysilicon layers 26c and 26d is formed with enhanced process control and inhibited etching into the active region 13c of the semiconductor substrate 10 incident to use of the patterned first hard mask layer 24a' as an etch detection and endpoint detection layer.

As is further understood by a person skilled in the art, the preferred embodiment of the present invention is illustrative of the present invention rather than limiting of the present invention. Revisions and modifications may be made to methods, materials, structures and dimensions employed for forming a bipolar complementary metal oxide semiconductor (BiCMOS) integrated circuit microelectronic fabrication in accord with the preferred embodiment of the present invention while still providing a method in accord with the present invention, further in accord with the accompanying claims.

What is claimed is:

1. A method for forming a patterned silicon layer comprising:

providing a substrate having formed thereover a first silicon layer selected from the group consisting of amorphous silicon layers, polycrystalline silicon layers, monocrystalline silicon layers and germanium alloy layers thereof, the first silicon layer having a first region laterally adjacent a second region;

forming over the first silicon layer, including the first region and the second region, a second silicon layer selected from the group consisting of amorphous silicon layers, polycrystalline silicon layers, monocrystalline silicon layers and germanium alloy layers thereof;

forming interposed between the first silicon layer and the second silicon layer in the first region, but not in the second region, an etch detection layer;

forming over the second silicon layer a masking layer which defines a first aperture over the first region and a second aperture over the second region; and etching simultaneously the second silicon layer within the first aperture and the second aperture while employing the etch detection layer as an endpoint detection layer for etching the second silicon layer with respect to the first silicon layer.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the first silicon layer does not include silicon oxide layers, silicon nitride layers and silicon oxynitride layers.

4. The method of claim 1 wherein the second silicon layer does not include silicon oxide layers, silicon nitride layers and silicon oxynitride layers.

5. The method of claim 1 wherein the first silicon layer is formed to a thickness of from about $10^3$ to about $10^7$ angstroms.

6. The method of claim 1 wherein the second silicon layer is formed to a thickness of from about $10^3$ to about $10^4$ angstroms.

7. The method of claim 1 wherein the etch detection layer is formed from a material selected from the group consisting of silicon oxide materials, silicon nitride materials and silicon oxynitride materials.

8. A method for forming a patterned silicon layer comprising:

providing a semiconductor substrate formed from a material selected from the group consisting of monocrystalline silicon and monocrystalline silicon-germanium alloy materials, the semiconductor substrate having a first region laterally adjacent a second region;

forming over the semiconductor substrate, including the first region and the second region, a polycrystalline layer formed from a material selected from the group consisting of silicon and silicon-germanium alloy materials;

forming interposed between the semiconductor substrate and the polycrystalline layer in the first region but not the second region an etch detection layer;

forming over the polycrystalline layer a masking layer which defines a first aperture over the first region and a second aperture over the second region; and etching simultaneously the polycrystalline layer within the first aperture and the second aperture while employing the etch detection layer as an endpoint detection layer for etching the second silicon layer with respect to the first silicon layer.

9. The method of claim 8 wherein the polycrystalline layer is formed to a thickness of from about 1000 to about 5000 angstroms.

10. The method of claim 8 wherein the etch detection layer is formed from a material selected from the group consisting of silicon oxide materials, silicon nitride materials and silicon oxynitride materials.

11. The method of claim 8 wherein a patterned polycrystalline layer formed from the polycrystalline layer is employed as an extrinsic base region within a vertical bipolar transistor device.

* * * * *